US012658239B1

(12) United States Patent (10) Patent No.: US 12,658,239 B1
Belateche (45) Date of Patent: Jun. 16, 2026

(54) HIGH-RELIABILITY PROCESSING-IN-MEMORY WITH TRANSPOSE SUPPORT USING SPLIT-6T SRAM

(71) Applicant: BTQ Technologies Corp., Vancouver (CA)

(72) Inventor: Zachary Irving Belateche, Pasadena, CA (US)

(73) Assignee: BTQ Technologies Corp., Vancouver (CA)

( * ) Notice: Subject to any disclaimer, the term of this patent is extended or adjusted under 35 U.S.C. 154(b) by 184 days.

(21) Appl. No.: 18/302,674

(22) Filed: Apr. 18, 2023

Related U.S. Application Data

(60) Provisional application No. 63/333,003, filed on Apr. 20, 2022.

(51) Int. Cl.
| *G11C 11/54* | (2006.01) |
| *G11C 11/408* | (2006.01) |
| *G11C 11/4091* | (2006.01) |
| *G11C 11/4093* | (2006.01) |
| *G11C 11/412* | (2006.01) |
| *G11C 11/419* | (2006.01) |

(52) U.S. Cl.
CPC ...... *G11C 11/4091* (2013.01); *G11C 11/4085* (2013.01); *G11C 11/4093* (2013.01); *G11C 11/412* (2013.01); *G11C 11/419* (2013.01); *G11C 11/54* (2013.01)

(58) Field of Classification Search
CPC ..... G11C 11/412; G11C 11/419; G11C 11/54; G11C 11/4091; G11C 11/4085
See application file for complete search history.

(56) References Cited

U.S. PATENT DOCUMENTS

| 7,148,404 | B2 | 12/2006 | Hogenhaug et al. |
| 7,158,404 | B2 | 1/2007 | Lai |
| 7,359,275 | B1 | 4/2008 | Wu |
| 7,362,606 | B2 * | 4/2008 | Chuang ................. G11C 11/412 |
| | | | 257/E27.099 |
| 7,471,570 | B2 | 12/2008 | Morton et al. |
| 9,153,594 | B2 | 10/2015 | Jain |
| 9,286,970 | B2 | 3/2016 | Kuo et al. |
| 9,460,760 | B2 | 10/2016 | Jayaraman et al. |
| 9,786,357 | B2 | 10/2017 | Abu-Rahma et al. |
| 10,269,419 | B2 | 4/2019 | Kulkarni et al. |
| 10,283,191 | B1 | 5/2019 | Pathak et al. |
| 12,046,276 | B2 | 7/2024 | Yang et al. |

(Continued)

*Primary Examiner* — Mushfique Siddique
(74) *Attorney, Agent, or Firm* — Finnegan, Henderson, Farabow, Garrett & Dunner, LLP

(57) ABSTRACT

A processor has a Static Random Access Memory (SRAM) array with individual SRAM cells, each individual SRAM cell has six transistors including a first access transistor, a second access transistor, a first N-Channel Metal-Oxide Semiconductor (NMOS) transistor cross-coupled with a first P-Channel Metal-Oxide Semiconductor (PMOS) transistor forms a first inverter, and a second NMOS transistor cross-coupled with a second PMOS transistor forms a second inverter. Split word line drivers are connected to the SRAM array. The split word line drivers include left word line drivers and right word line drivers that are alternately activated to drive a single sense amplifier per bit line.

7 Claims, 14 Drawing Sheets

(56)                    References Cited

U.S. PATENT DOCUMENTS

| | | |
|---|---|---|
| 2007/0028076 A1 | 2/2007 | Wezelenburg |
| 2009/0059688 A1* | 3/2009 | Pille ..................... G11C 11/413 |
| | | 365/230.06 |
| 2009/0073776 A1* | 3/2009 | Kodama ............. H10D 64/035 |
| | | 257/390 |
| 2010/0329068 A1* | 12/2010 | Sasaki ................... G11C 11/412 |
| | | 365/230.06 |
| 2013/0122672 A1 | 5/2013 | Or-Bach et al. |
| 2014/0247673 A1 | 9/2014 | Muralimanohar et al. |
| 2016/0189769 A1* | 6/2016 | Jeloka ................... G11C 15/04 |
| | | 365/154 |
| 2018/0158517 A1* | 6/2018 | Shu ..................... G06F 9/30029 |
| 2019/0305971 A1 | 10/2019 | Li et al. |
| 2019/0312728 A1 | 10/2019 | Poeppelmann |
| 2021/0072986 A1* | 3/2021 | Yudanov ............... G06F 9/3001 |
| 2021/0295904 A1* | 9/2021 | Kawasumi ............ H10B 10/12 |
| 2021/0342676 A1 | 11/2021 | Hoang et al. |
| 2022/0036942 A1* | 2/2022 | Wang ................... G11C 11/417 |
| 2022/0229663 A1* | 7/2022 | Martinez ............ G06F 15/7821 |

* cited by examiner

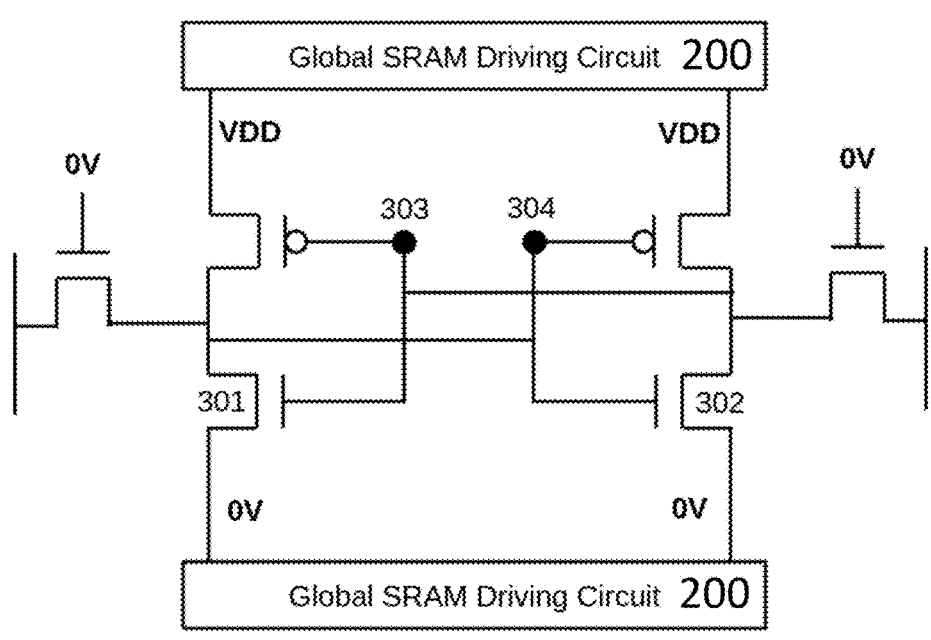
FIG. 7A
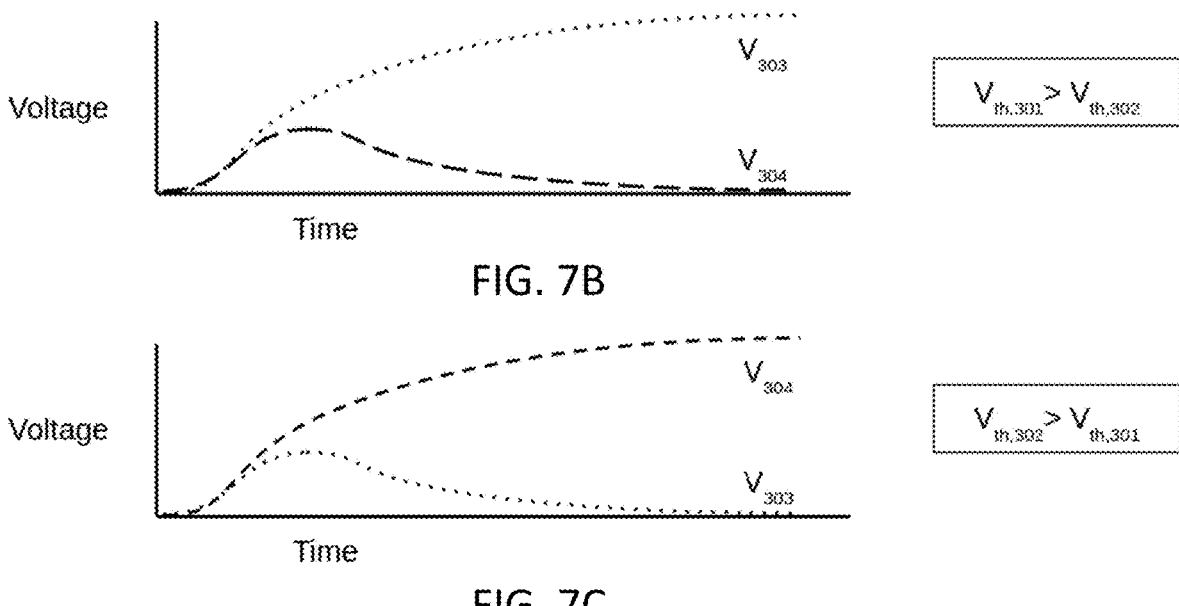
FIG. 7B
FIG. 7C

To read data in Row A:

1. Bring left word-line for Row A to VDD.

2. Latch left sense amplifier for every column.

To write data to Row A:

1. Bring both word-lines for Row A to VDD.

2. Drive data on bit-lines using Write Drivers.

To perform a logic operation
on Row A and Row B:

1. Bring left word-line for
Row A to VDD.

2. Simultaneously bring right
word-line for Row B to VDD.

3. Latch both left and right
sense amplifiers.

4. Send control signals to
column logic to perform the
operation.

Split
Word-Line
Drivers

50

52

Single-Ended Sense Amplifiers 54

To transpose data from Row
A into Column B:

1. Bring left word-line for
Row A to VDD.

2. Latch left sense amplifier
for every column.

3. Send row data to
word-line drivers.

4. Bring bit-lines for Column
B to GND.

5. Activate word-line drivers
based on row data.

To transfer data from one column to another:

1. Bring left word-line for Row A to VDD.

2. Latch left sense amplifier for every column.

3. Route data based on selected routing configuration.

Example routing configurations include shifting the carry register for RBR, broadcasting the mask register for convolution, and constant-geometry NTT swapping.

HIGH-RELIABILITY PROCESSING-IN-MEMORY WITH TRANSPOSE SUPPORT USING SPLIT-6T SRAM

CROSS-REFERENCE TO RELATED APPLICATION

This application claims priority to U.S. Provisional Patent Application 63/333,003, filed Apr. 20, 2022, the contents of which are incorporated herein by reference.

This application has a common specification and is commonly owned with the following concurrently filed applications RADS-003/01US, RADS-003/03US, and RADS-003/04US.

FIELD OF THE INVENTION

This invention is directed toward hardware processor architectures. More particularly, this invention is directed toward a hardware processor architecture for secure storage, polynomial multiplication, convolution, and butterfly transforms.

BACKGROUND OF THE INVENTION

FIG. 1 illustrates a known Static Random Access Memory (SRAM) cell. The SRAM cell has two inverters 10 and 12 forming a bi-stable flip-flop connected to internal circuitry by two access transistors 14 and 16. When the cell is not addressed, the two access transistors are closed and the data is kept in a stable state, latched within the flip-flop.

FIG. 2 illustrates a read operation. To select a cell, the two access transistors 14 and 16 are powered on by word line 18 so the flip-flop can be connected to the internal SRAM circuitry. The selected row is set at VCC. The two flip-flop sides are thus connected to a pair of bit lines or column lines. During a read operation these two bit lines are connected to the sense amplifier 20 that recognizes if a logical data "1" or "0" is stored in the flip-flop. The sense amplifier 20 then transfers the logic state to the output buffer 22.

FIG. 3 illustrates a write operation. During a write operation, data comes from the input pad 24. It then moves to the write circuitry 26. The write circuitry 26 drives the data into the flip-flop. When the read and write operations are completed the word line 18 is set to 0V. The flip-flop keeps its original data for a read cycle or stores the new data which was loaded during the write cycle.

FIG. 4 illustrates a known six transistor (6T) SRAM cell. Each inverter has one NMOS transistor and one PMOS transistor. NMOS access transistors 14 and 16 are connected to the word line 18.

There is a need to utilize known SRAM building blocks in sophisticated processor architectures. More particularly, there is a need to utilize SRAM building blocks for secure storage, polynomial multiplication, convolution and butterfly transforms.

SUMMARY OF THE INVENTION

A processor has a Static Random Access Memory (SRAM) array with individual SRAM cells, each individual SRAM cell has six transistors including a first access transistor, a second access transistor, a first N-Channel Metal-Oxide Semiconductor (NMOS) transistor cross-coupled with a first P-Channel Metal-Oxide Semiconductor (PMOS) transistor forms a first inverter, and a second NMOS transistor cross-coupled with a second PMOS transistor forms a second inverter. Split word line drivers are connected to the SRAM array. The split word line drivers include left word line drivers and right word line drivers that are alternately activated to drive a single sense amplifier per bit line.

BRIEF DESCRIPTION OF THE FIGURES

The invention is more fully appreciated in connection with the following detailed description taken in conjunction with the accompanying drawings, in which:

FIG. 7A characterizes hot carrier injection operations performed in accordance with an embodiment of the invention.

FIGS. 7B and 7C illustrate node voltages during hot carrier injection.

Like reference numerals refer to corresponding parts throughout the several views of the drawings.

DETAILED DESCRIPTION OF THE INVENTION

Cryptographically Agile Secure Hardware (CASH) is disclosed. The CASH is an integrated circuit designed to run next-generation security functions in a single compact, low-power circuit. The CASH is much smaller, much lower power, and more affordable to produce than conventional architectures, which makes it well suited for cost, area, and power-constrained applications like smart cards, SIM cards, 2-factor authentication tokens, and battery-operated Internet of Things (IoT) devices.

The CASH has a mixed-signal processing-in-memory unit that performs a number of individual functions that can perform multiple cryptographic algorithms. It is also able to act as a "physically unclonable function", or PUF, using transistor mismatch to derive a constant secret key unique to each device.

The CASH is designed to enable both existing classical cryptography schemes and emerging post-quantum cryptography schemes in a compact, low-power footprint. A chip with CASH can perform lattice-based, NIST Post-Quantum Cryptography (PQC)-standardized key encapsulation and signature operations using private keys derived from unique physical properties of the chip. The CASH can also be reprogrammed to perform a variety of cryptographic schemes already in use (e.g., RSA, AES, SHA, Elliptic Curve Cryptography, etc.). The concept of running many cryptographic algorithms with one piece of hardware is called "cryptographic agility", and it is one of the key advantages of the CASH.

Figure 1:
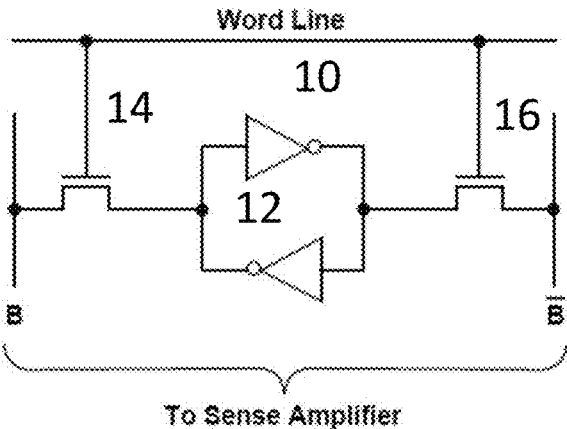
FIG. 1 illustrates a prior art SRAM cell.
Figure 2:
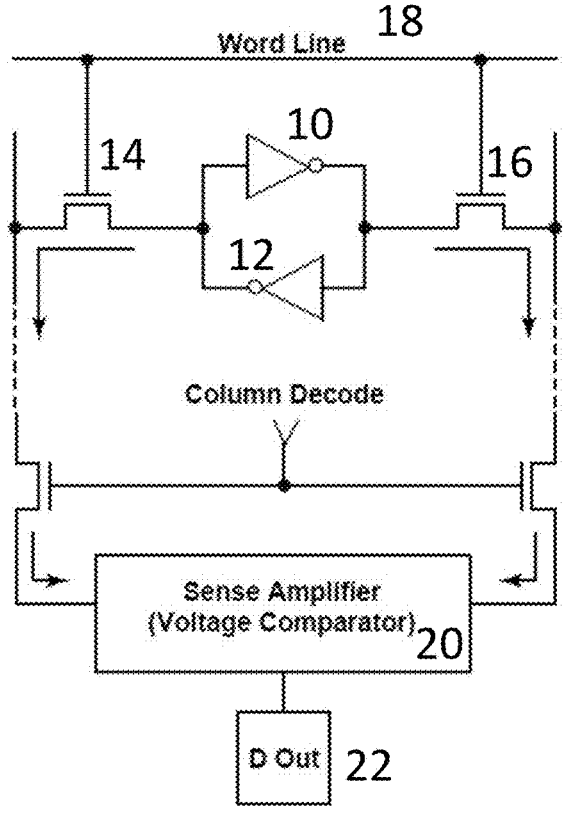
FIG. 2 illustrates a read operation performed by a prior art SRAM cell.
Figure 3:
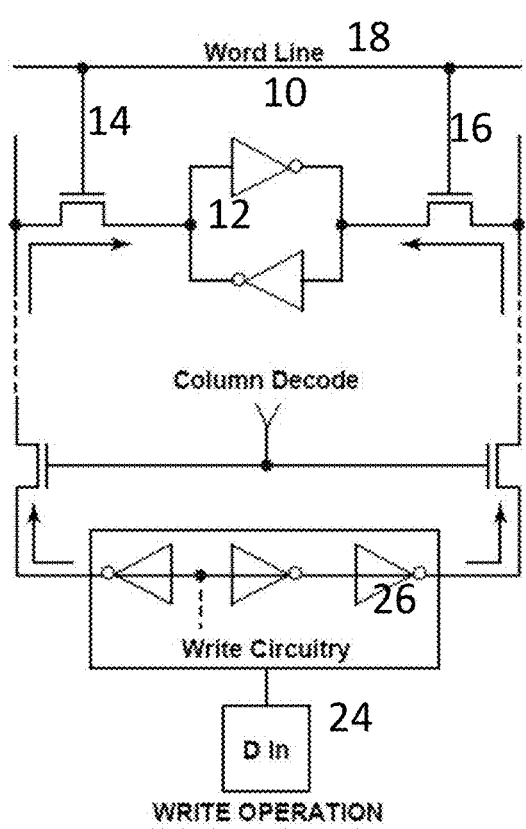
FIG. 3 illustrates a write operation performed by a prior art SRAM cell.
Figure 4:
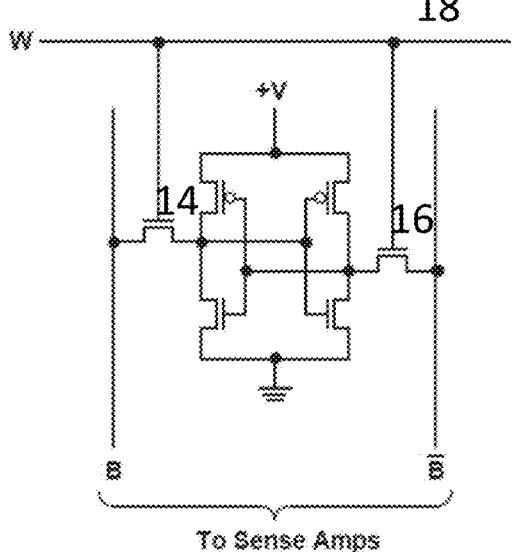
FIG. 4 illustrates a prior art 6T SRAM cell.
Figure 5:
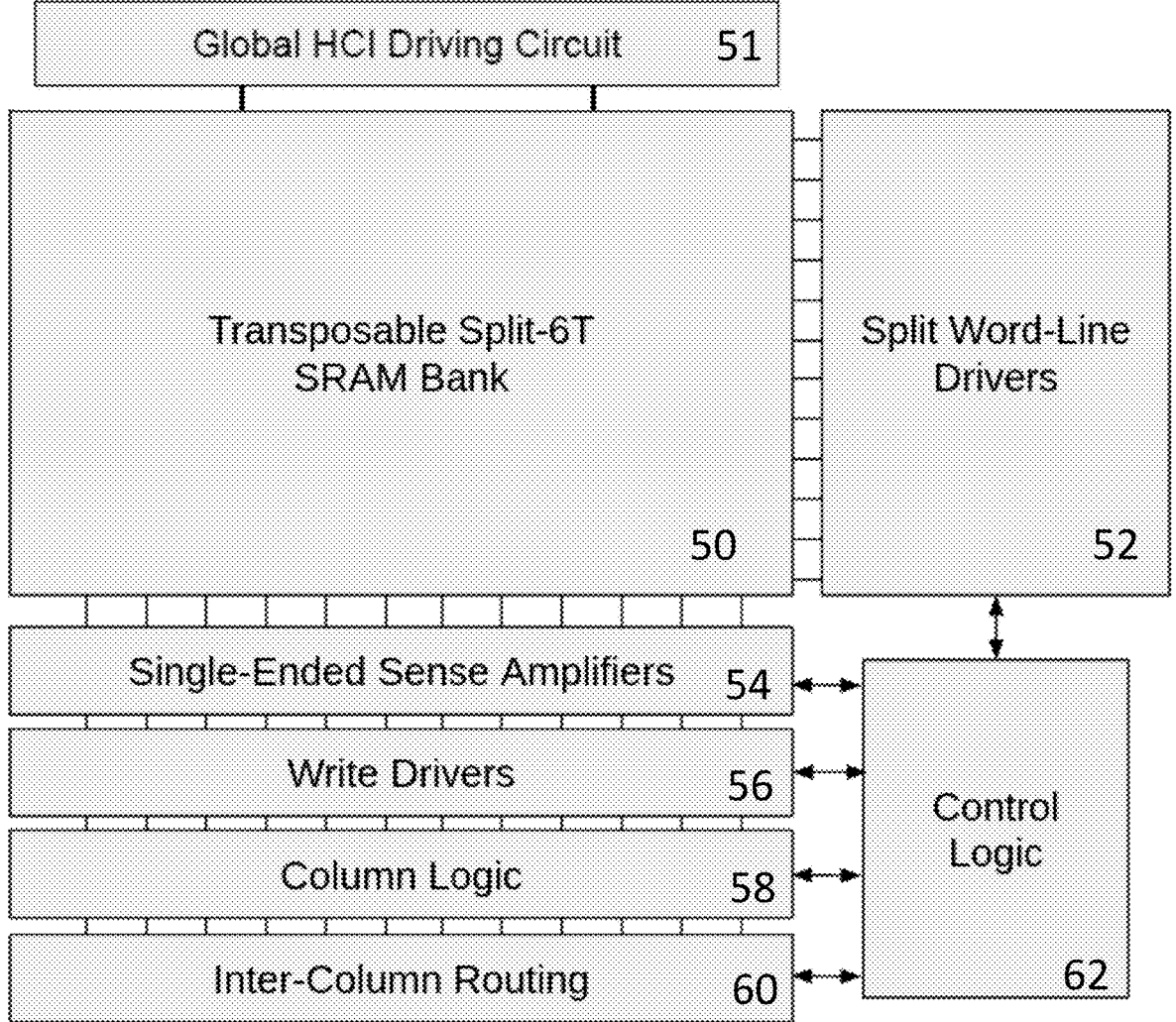
FIG. 5 illustrates a cryptographically agile secure hardware (CASH) architecture utilized in accordance with an embodiment of the invention.

The CASH core is a mixed-signal SRAM array with processing-in-memory (PIM) capabilities. FIG. 5 illustrates the architecture with a split 6T SRAM bank 50, a global hot carrier injection (HCI) driving circuit 51, and split word-line drivers 52. Single-ended sense amplifiers 54 are connected to write drivers 56, which are connected to column logic 58 and inter-column routing 60. Blocks 52, 54, 56, 58 and 60 are responsive to control logic 62.

Disclosed herein is a modified SRAM macro called the Secure Parallel Adder and Multiplier SRAM, or SPAM-SRAM, which performs four major functions: random bit generation, split 6T logic in memory, polynomial multiplication and redundant binary operations, as detailed below.

When a standard 6T SRAM cell is powered up, it randomly takes on an initial value of 0 or 1, based on the threshold voltage mismatch of the transistors in the cell. This value can provide a random seed for the generation of a cryptographic key.

However, this value is not stable. As the physical properties of the transistors change due to temperature changes and device aging, the startup value of a cell may change from a 0 to a 1, or vice versa. The CASH remedies this by shifting the threshold voltages of the transistors in the SRAM cell using HCI. This is performed by changing the supply voltages of the SRAM cells using Global HCI driving circuit 51, while writing data to those SRAM cells.

HCI is performed in an unmodified 6T SRAM cell with very little overhead, allowing highly secure, tamper-proof, and in-place storage of secret data. Additional stability can be achieved by dedicating special, double-pitch or quad-pitch rows in the SRAM array to key generation and storage.

The constant set of random bits generated by the CASH can be used alongside a conventional key generation algorithm to generate a secret key for every device, which can be used by the CASH to prove its identity securely and uniquely. However, under different environmental conditions, including temperature and chip age, the sequence of random bits may be different. This results in a different secret key, preventing the CASH from proving its identity.

The CASH uses a technique called Hot Carrier Injection, or HCI, to prevent the sequence of random bits generated by the SRAM bit cells from changing over environmental conditions. This allows the CASH to securely and reliably prove its identity using a key generated from the random bit stream.

HCI alters the threshold voltage of the N-channel MOS-FETs in the SRAM cell, so that its start-up behavior is constant and predictable. The SPAM-SRAM uses reverse-direction HCI, which results in larger threshold voltages shifts compared to forward-direction HCI for the same duration and current density during HCI burn-in.

Additional stability can be achieved by dedicating special, double-pitch or quad-pitch rows in the SRAM array to key generation and storage. This maintains compatibility with a standard multiplexed SRAM array and increases stability without significantly compromising density.

Figure 6:
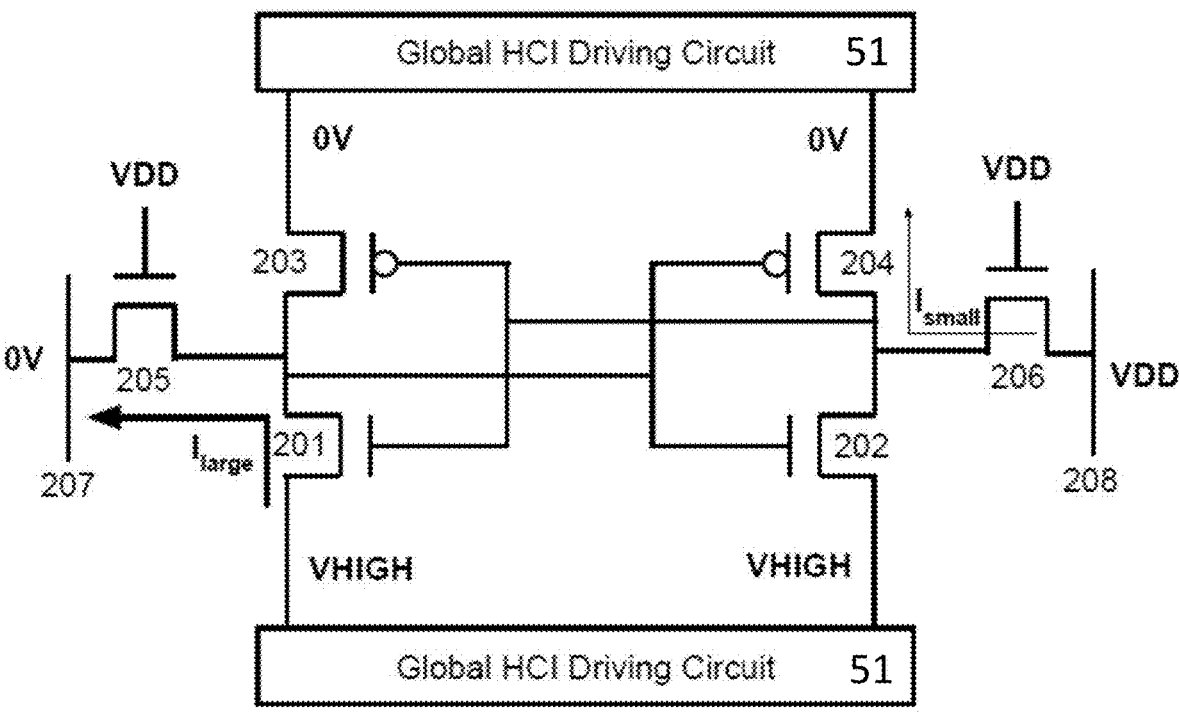
FIG. 6 illustrates programming an SRAM cell through hot carrier injection in accordance with an embodiment of the invention.

Programming an SRAM cell through HCI is shown in FIG. 6. The SRAM cell has six transistors including a first access transistor 205, a second access transistor 206, a first N-Channel Metal-Oxide Semiconductor (NMOS) transistor 201 cross-coupled with a first P-Channel Metal-Oxide Semi-conductor (PMOS) transistor 204 to form a first inverter. A second NMOS transistor 202 is cross-coupled with a second PMOS transistor 203 to form a second inverter.

Programming is performed using a new block called the Global HCI Driving Circuit 51. It controls the voltages at the source nodes of the transistors in the SRAM cell to enable HCI programming.

To program the SRAM cell, the source voltage of transistors 201 and 202 are brought to a high voltage, VHIGH. Simultaneously, the source voltage of transistors 203 and 204 is brought to 0V. Then, the existing write buffers of the SRAM cells are used to drive bitline 207 to 0V. This causes a large current to flow through the transistor 201 in the reverse direction (from source to drain), which results in hot carriers being injected into the transistor oxide. This shifts the threshold voltage of the MOSFET to influence its startup behavior.

Because most of the voltage drop occurs through transistor 201, transistor 205 experiences much less hot carrier injection. A small current also flows through transistor 204, but p-channel MOSFETs do not experience significant hot carrier injection effects compared to n-channel MOSFETs. Transistors 202 and 203 are both in the off-state during this process.

There are two different ways the burn-in process can be utilized to store key data, each with different advantages and disadvantages.

Each SRAM cell's initial value is measured, and then for each cell, its measured value is burned in:

(a) This increases reliability, as the threshold voltage shift due to HCI is in the same direction as the threshold voltage mismatch inherent in the SRAM cell. Because these two phenomena both affect the cell's startup state, if they are both in the same direction, the cell's startup state will more stably evaluate to 0 or 1.

(b) However, these random bits are not in the form of a key. To generate a key to perform cryptographic operations, a key generation algorithm needs to be run in-memory to convert the initial values into a secret key with the proper distribution for the cryptographic algorithm (for example, a centered binomial distribution). This decreases overall performance.

Each SRAM cell's initial value is measured. These values are fed into a key generation algorithm, and the generated cryptographic key is burned into the corresponding SRAM cells.

(a) Because the key itself is directly burned into the SRAM, it does not need to be regenerated from seed data. Thus, the time to generate a key is a single cycle. This offers a significant performance improvement.

(b) However, the threshold voltage shift due to HCI may not be in the same direction as the threshold voltage mismatch inherent to each SRAM cell. Because these two phenomena both affect the cell's startup state, if they are working in opposite directions, the cell's startup state may be less stable.

While existing technologies have used SRAM cells to generate random bits and have used HCI to program startup values of SRAM cells, the SPAM-SRAM cell is unique in that it performs reverse-direction HCI and performs HCI in a standard 6T SRAM bit cell.

This SPAM-SRAM architecture allows a highly efficient, lower voltage HCI operation that is pitch-compatible and voltage-compatible with a standard 6T SRAM array, representing a significant improvement over existing methods that require more complex bitcells, larger voltages, or negative voltages.

When the SRAM is powered up, the startup value is determined by the threshold voltage mismatch of the 4 transistors in the cross-coupled inverters. FIG. 7A shows the various nodes in the cross-coupled inverters. FIG. 7B shows voltages on nodes when the voltage on node 301 is greater than the voltage on 302 and FIG. 7C shows voltages when the voltage on node 302 is greater than the voltage on node 301.

If the threshold voltage of transistor 301 is greater than that of transistor 302 during power-up, more current flows through transistor 302 during the power-up process, causing the voltage at node 304 to be lower than the voltage at node 303. As the SRAM cell's positive feedback operation begins, this amplifies the voltage at node 303 to VCORE and the voltage at node 304 to 0V. The SRAM cell is reset by bringing VCORE to 0V and then back up to its nominal voltage. This initiates the above power-up process again, setting the state to whatever startup state has been burnt in through HCI. However, this clears out all of the other data stored in the memory bank.

Once this startup process occurs, the data programmed into the SRAM through HCI exists in the right location in memory for the CASH to immediately begin performing processing-in-memory operations on that data. Those operations can include key generation algorithms, signing algorithms, or other cryptographic operations.

Figure 8:
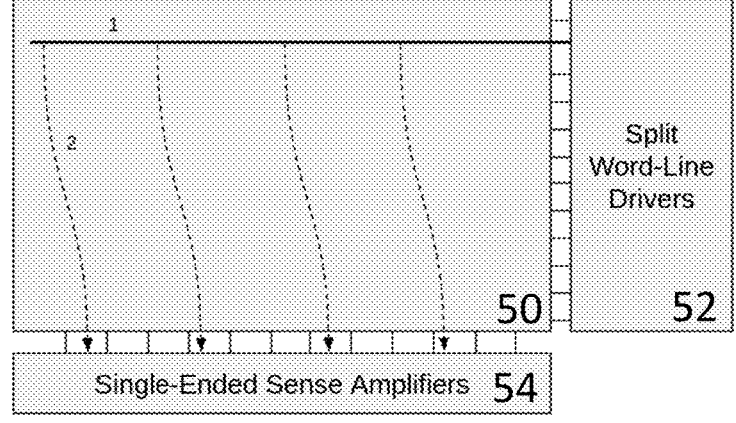
FIG. 8 illustrates a conventional SRAM read operation.
Figure 9:
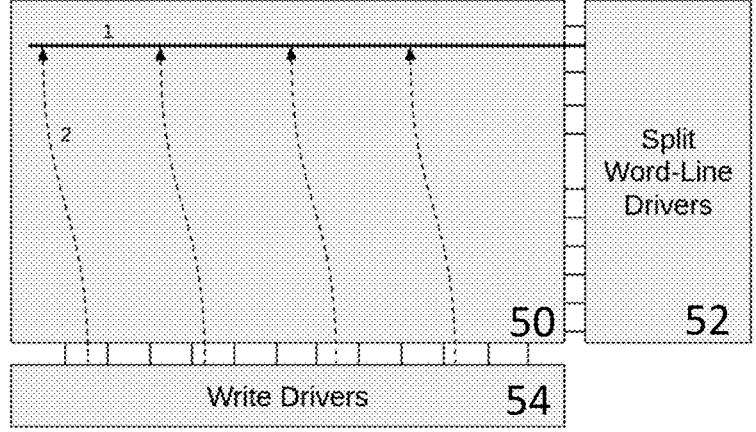
FIG. 9 illustrates a conventional SRAM write operation.

Processing-in-memory is a key function of the CASH, offering low-power, rapid primitive operations for implementing cryptographic schemes. The PIM array can act as a conventional memory bank, so that data can be written to and read from the PIM array using conventional read and write operations, as shown in FIGS. 8 and 9.

The PIM array uses single-ended sense amplifiers to perform wide bitwise logic operations. A small amount of digital logic below each column allows for ultra-high-parallelism bit-serial arithmetic. Novel inter-column communication circuits allow the columns of the SPAM-SRAM array to communicate with one another very efficiently.

Split-WL circuits enable a unique transpose write operation. This transpose operation allows bit-serial PIM operations to be easily integrated into a bit-parallel memory architecture.

Split-6T SRAM arrays exist in literature with two main applications: low-power SRAM arrays, and analog PIM arrays. An overview of both is provided here to indicate how they differ from the disclosed Split-6T SRAM architecture.

Some designs in literature use a Split-6T array to reduce SRAM active power consumption by preventing data from being disturbed during write operations at a low supply voltage. While these designs use a Split-6T bit cell, they do not use any peripheral circuits to enable PIM operations. The disclosed design uses several additional cells to enable the Split-6T array to be used for PIM operations.

Some designs in the literature use a Split-6T array for analog PIM operations. They activate one world line from every row and measure the current on the bit line. The disclosed architecture is a digital PIM; we only activate two word-lines simultaneously, rather than one for every row. As such, the peripheral circuits for our PIM array are entirely different from those of the analog PIM designs.

Existing SRAM PIM implementations have issues with reliability and with design complexity that prevent them from being deployed commercially at scale. Most SRAM PIM designs activate two word lines simultaneously, which can cause bits in the array to flip during a read operation (an error called a "read disturb"). The CASH uses a split-WL cell to prevent this read disturb issue. This increases the reliability of PIM operations significantly. The analog computation circuitry can perform wide bitwise logic operations in a split-6T SRAM cell. In a split 6T cell, the SRAM word lines are split into a left-WL and a right-WL.

Figure 10:
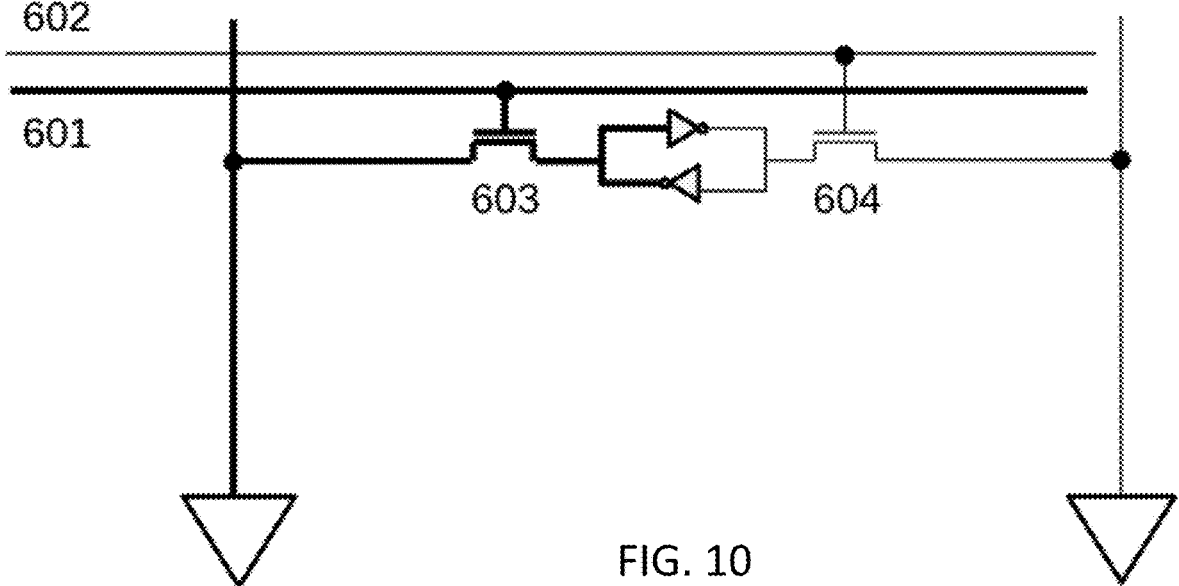
FIG. 10 illustrates a single-ended split 6T SRAM read performed in accordance with an embodiment of the invention.

This allows us to read out a single word by only activating one read transistor and one sense amplifier, as shown in FIG. 10. In this case, only the left-WL (601) is activated, while the right-WL (602) is kept at 0V. This activates the left access transistor (603) but not the right access transistor (604). This reduces the read power consumption for the SRAM cell because it only requires one bit line to be discharged and one sense amplifier to be activated.

Figure 11:
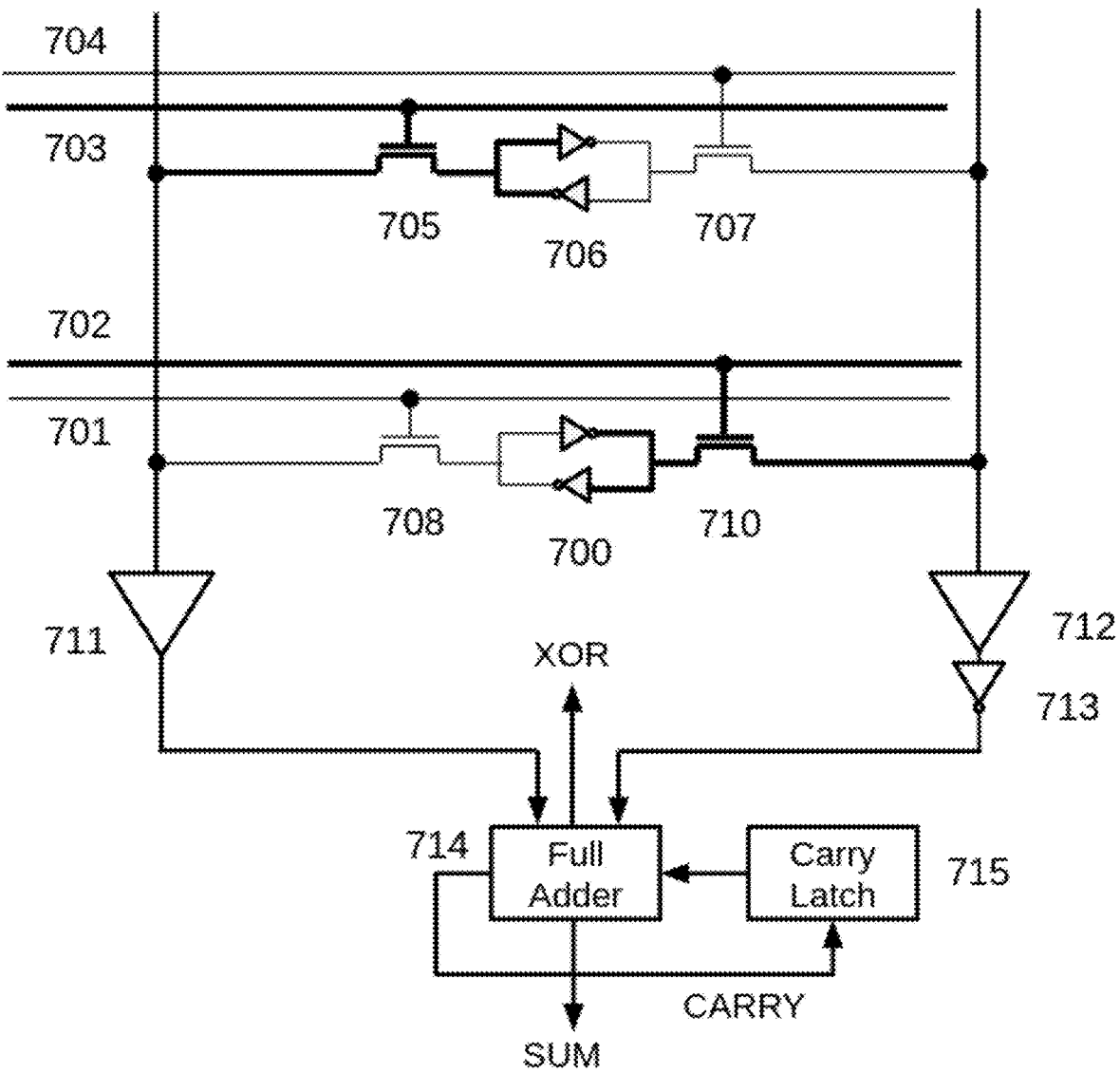
FIG. 11 illustrates a disturb-free dual read with full adder based column logic utilized in accordance with an embodiment of the invention.
Figure 12:
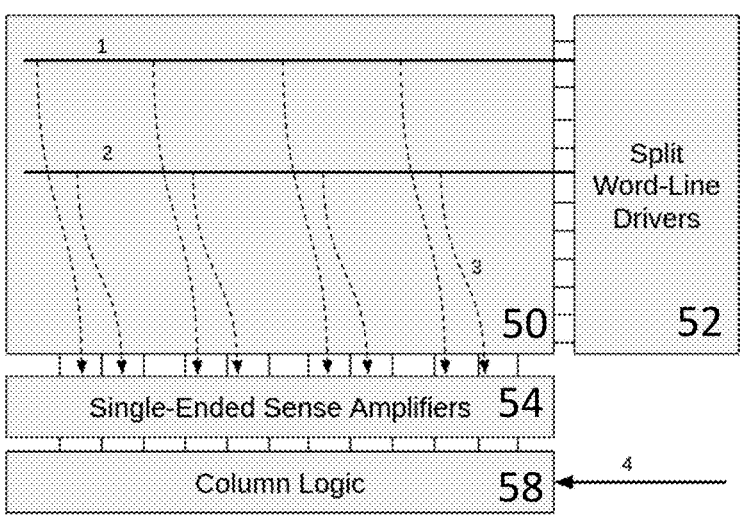
FIG. 12 illustrates SRAM logic-in-memory data flow in accordance with an embodiment of the invention.

The split-WL circuit also allows one to read two rows at once without any read-disturb issues, as shown in FIG. 11. In this case, for cell 700, the right-WL (701) is activated, while the left-WL (702) is kept at 0V. This causes the value of cell 700 to be connected to the right sense amplifier (712) through its left access transistor (710). For cell 706, the left-WL (703) is active, while the right-WL (704) is kept at 0V, so cell 706 is connected to the left sense amplifier (711) through its left access transistor (705). Because each bit line is connected to a separate cell, this eliminates the need for pulsed word line signals or word line under-drive to prevent read disturb issues. The dataflow for in-memory logic operations in the split-WL array is shown in FIG. 12.

The current state-of-the-art for digital SRAM PIM architectures uses single word lines rather than split word lines. This causes potential read disturb issues when reading out two rows of memory simultaneously. Current architectures remedy this problem using word line under-drive, which slows down memory operation, or word line pulsing, which requires complex pulse circuitry. The disclosed Split 6T cell allows highly reliable and simple reading of multiple rows at once.

For certain parallel multiplication algorithms, data must be arranged along the columns of the SRAM array. However, this is not compatible with a conventional system architecture, which reads and writes data to the rows of the SRAM array.

The disclosed split word line approach enables a novel transposition operation in a conventional push-rule 6T bit cell, allowing us to write data to a column of the SRAM array. This maintains compatibility between column-wise PIM operations and row-wise conventional read/write operations with minimal area overhead, allowing us to integrate the PIM into a complete system. The split-WL circuit also allows us to write data to a column of the SRAM rather than to a row of the SRAM.

Figure 13:
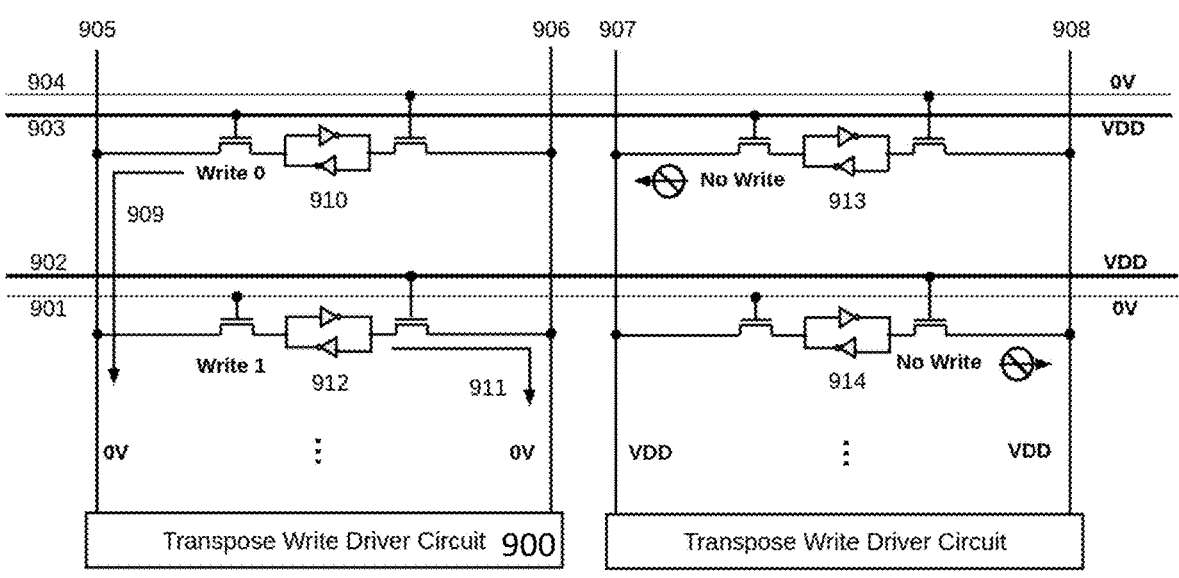
FIG. 13 illustrates transpose write using split 6T SRAM cells in accordance with an embodiment of the invention.

The "transpose write" is shown in FIG. 13. This operation is important for converting from bit-parallel to bit-serial representations of data. A new block is added at the bottom of each column of the SRAM array called the Transpose Write Driver 900, which controls the voltages on the bit lines during transpose operations.

A column is selected by driving both of its bit lines (905, 906) to 0V using the Transpose Write Driver 900. To write a 0 to cell 910, its left word line (903) is brought to VDD and its right word line (904) stays at 0V. This causes current to flow through path 909, bringing the value in the cell to 0.

Similarly, to write a 1 to cell 912, its right word line (902) is brought to VDD and its left word line (901) stays at 0V. This causes current to flow through path 911, bringing the value in the cell to 1.

Figure 14:
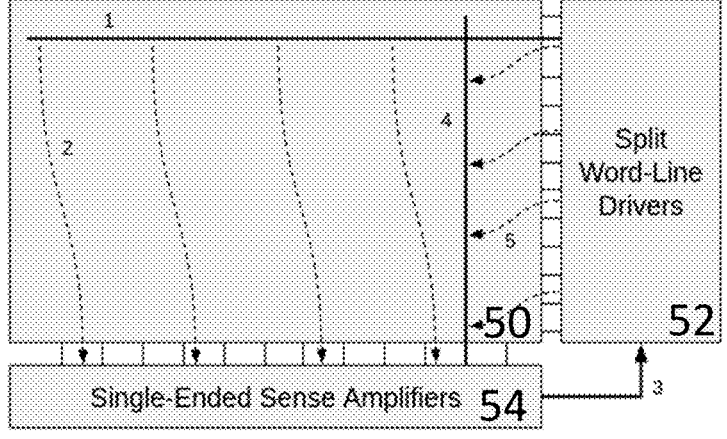
FIG. 14 illustrates transpose operations in the split word line array in accordance with an embodiment of the invention.
Figure 15:
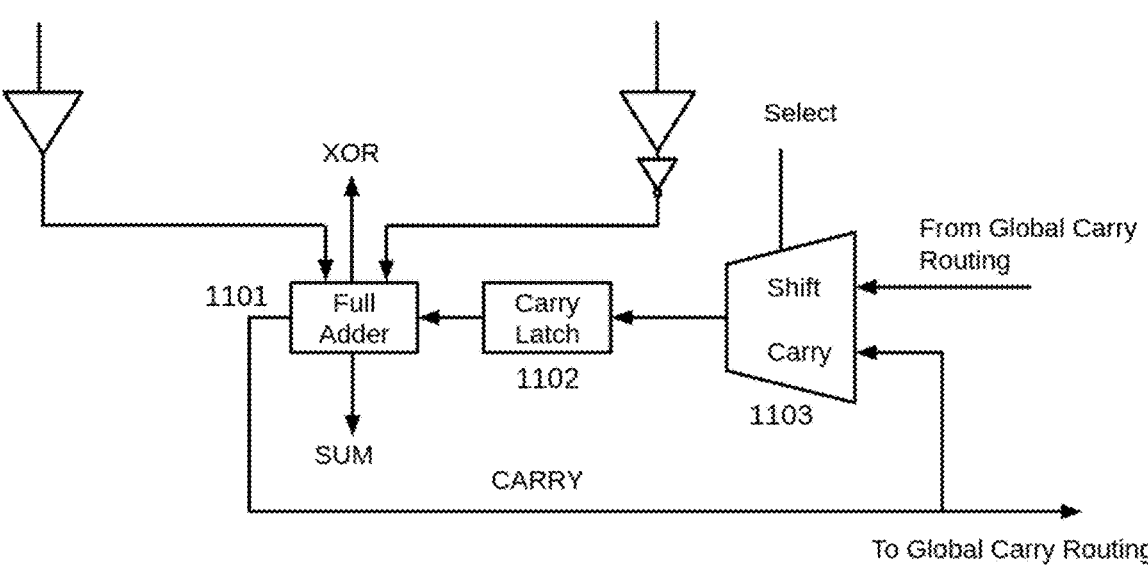
FIG. 15 illustrates a carry shift register based on a carry latch utilized in accordance with an embodiment of the invention.

Non-selected columns have their bit lines (907 and 908) driven to VDD by the Transpose Write Driver 900. Because the access transistors of the SRAM are N-channel MOS-FETs, this prevents data from being written to the cells in un-selected columns (913, 914). The dataflow for transpose operations in the split-WL array is shown in FIG. 14.

The current state-of-the-art architectures to enable transpose operations in SRAM memories require significantly increasing bit cell size, which is not viable for area-constrained applications like smart cards. The disclosed split-6T transposable SRAM architecture represents a significant innovation in integrating bit-serial PIM operations with a conventional bit-parallel host processor in an area-efficient manner.

The disclosed PIM architecture can read out two rows of data simultaneously, across many different columns of SRAM. However, to perform meaningful computation, we need to add logic circuits to process this data. Also, to perform complex cryptographic operations, we need to be able to transfer data between columns of SRAM.

The disclosed 6T SRAM array can utilize simple and efficient column logic based on standard logic cells, rather than having to use custom logic cells required by other SRAM PIM designs. The disclosed method for moving data between columns is highly efficient, as it re-uses registers that are already used elsewhere in the column logic.

A small amount of digital logic below each column allows for ultra-high-parallelism bit-serial arithmetic. This specialized hardware includes a lightweight full-adder circuit 1101, a carry latch circuit 1103, and a mask register. This hardware can also be used to shift data from one column to another, enabling complex operations required for running cryptographic algorithms.

The lightweight full-adder circuit enables bit-serial addition in each of the columns. Because of the split word line configuration, a conventional standard-cell full-adder 1101 can be used (714 in FIG. 11).

When performing bit-serial addition, the carry output of the full-adder 1101 needs to be stored between cycles. A clocked register 1102 is used to store the output carry from one cycle and use it as the input carry for the next cycle.

All of the carry latch circuits can also be used together as a shift register. By shifting the carry input multiplexer 1103 into "Shift" mode, the input data to the carry is set to an arbitrary input. This input can come from the output of any other carry register, allowing data to flow from one column to another. This configuration enables structured data shifting with a much lower hardware overhead compared to the state-of-the-art.

Figure 16:
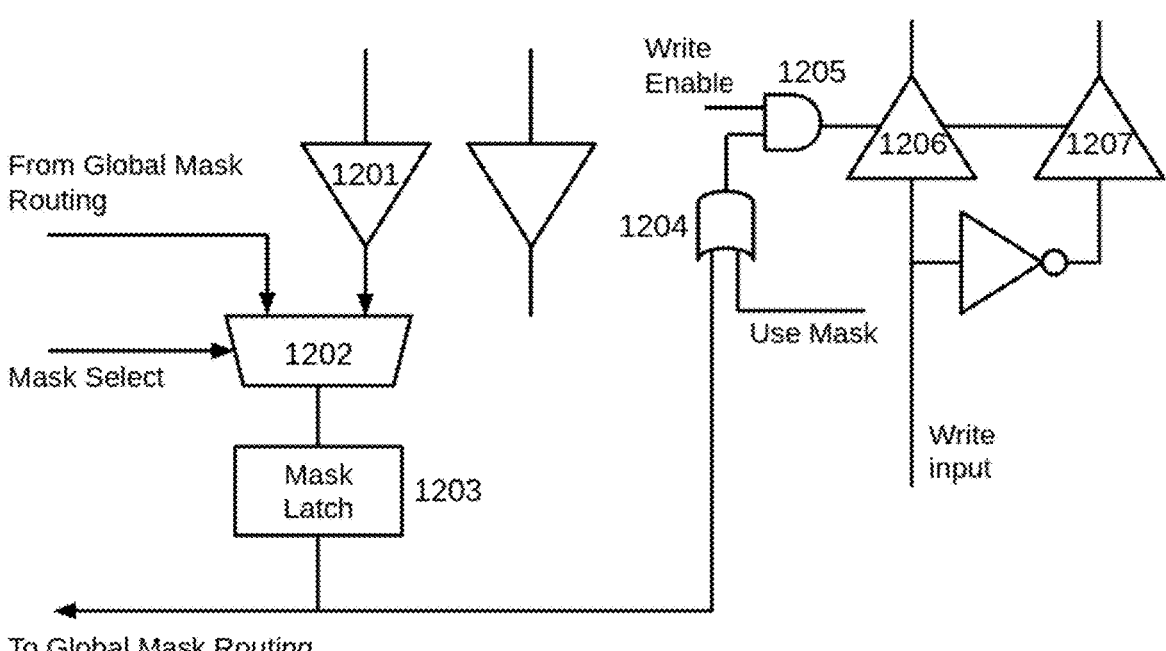
FIG. 16 illustrates a mask shift register based on mask logic, as used in accordance with an embodiment of the invention.

The column circuitry also includes a mask register to enable multiplication, as shown in FIG. 16. The mask register can toggle whether data is written to a bit cell or not.

If the "Use Mask" signal is 0 and the "Write Enable" signal is 1, gates 1204 and 1205 will control the enable signals of the write buffers 1206 and 1207 based on the value stored in the mask register 1203. If the latched mask value is 0, a write does not occur, while if the mask value is 1, a write does occur.

The mask register can load in values from the output sense amplifier 1201 in its own column, or it can get input data from other mask registers in the CASH. By setting the mask input multiplexer 1202 into "Shift" mode, the input data to the mask is set to an arbitrary input.

This input can come from the output of any other mask register, allowing data to flow from one column to another. Like with the carry, this configuration enables structured data shifting with a much lower hardware overhead compared to the state-of-the-art.

Figure 17:
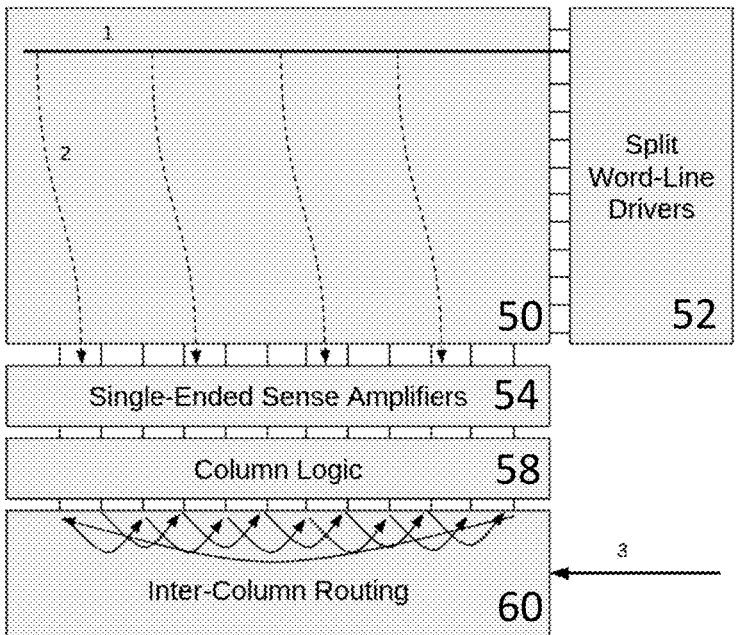
FIG. 17 illustrates SRAM inter-column communication utilized in accordance with an embodiment of the invention.

The dataflow for inter-column communication (carry and mask shifting) is shown in FIG. 17. The column logic circuitry also supports writing the result of a single-bit sum, the value stored in the carry register, or any other arbitrary input data back into the SPAM-SRAM array.

Current state-of-the-art SRAM PIM designs do not use Split-6T cells. As such, they have to use specialized, custom adders. The disclosed architecture allows us to use optimized full-adder circuits, increasing system performance and reducing design complexity. Also, current state-of-the-art PIM designs use additional large barrel shifting registers to route data in between columns. The disclosed CASH architecture leverages the carry and mask registers that already exist inside of the column logic to move data between columns, reducing the overhead of the routing logic.

Many emerging cryptographic algorithms rely on multiplying polynomials with many coefficients. These include algorithms like Kyber and Dilithium, which are going to be included in upcoming NIST standards for post-quantum cryptography. These algorithms will form the foundation for state-of-the-art cryptography in the upcoming years.

Existing cryptography chips, including chips in credit cards, SIM cards, and IoT devices, are incapable of performing these multiplication operations efficiently. To maintain security in the future, the chips inside these devices will need to be replaced. The disclosed CASH can perform these large polynomial multiplications very efficiently, making it a clear choice for running these cryptographic algorithms on resource constrained devices.

While multiple SRAM-based PIM technologies exist, the CASH architecture introduces a novel feature to increase the performance of polynomial multiplication in a PIM array: structured "swapping patterns" that allow data to be sent between columns of the array in several different arrangements.

By allowing programmers to select from one of a small number of predefined swapping patterns, the CASH achieves a compromise between efficiency and agility. Optimizing the CASH for specific algorithms like schoolbook polynomial multiplication or NTT butterfly operations entails optimizing the swapping patterns used in those algorithms.

It should be noted in the following sections that polynomial multiplication via matrices and the NTT are standard, pre-existing mathematical tools. Computation of the NTT via butterfly matrices is standard in software and hardware implementations of PQC. The novel contribution here consists of how these methods are mapped to swapping patterns within the CASH array.

Polynomial multiplication is the backbone of many cryptographic algorithms, including modern lattice-based cryptographic algorithms, including the NIST PQC standardization candidates Kyber, Saber, and Dilithium. Mathematically, polynomial multiplication is very similar to convolution, an operation used in many state-of-the-art AI workloads. Running these polynomial and convolution operations more efficiently, especially on resource constrained devices like credit cards, SIM cards, and IoT devices, would be very valuable.

However, existing architectures that rely on arrays of parallel processing elements, including PIM arrays, struggle to run these algorithms, as they cannot be easily broken up into single, small operations. Instead, different operations must communicate with one another, which can reduce performance.

Existing implementations of convolution and polynomial multiplication in PIM arrays are bottlenecked by communication between columns of data. By leveraging swapping patterns, the disclosed CASH significantly increases performance.

The CASH architecture increases the performance of schoolbook multiplies and wide convolutions through swapping patterns for broadcasting data from one column to many, and for cyclically shifting data between columns.

Figure 18:
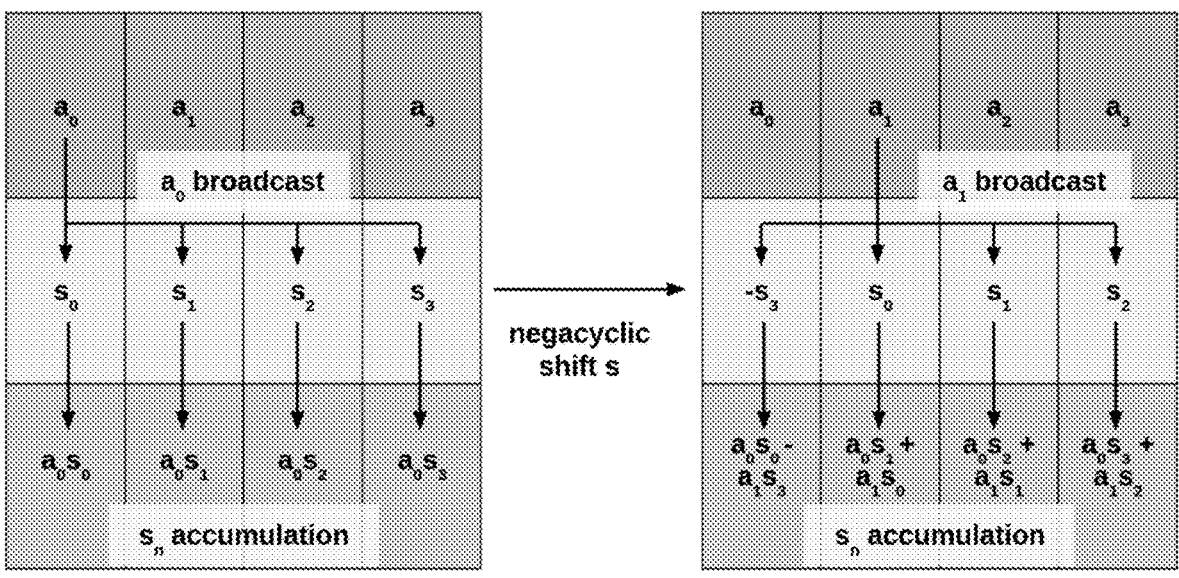
FIG. 18 illustrates schoolbook multiply dataflow.

Performing a schoolbook multiplication operation starts by storing each element of the two polynomials A and S as binary integers along columns of memory, as in FIG. 18. Then, one element of A, aj, is broadcast to every column of the computational array to be multiplied by each element of S. This broadcast is constructed using a fixed-geometry swapping pattern, allowing data from one column to be sent to all of the columns in the array efficiently.

For wide convolutions like those typically involved in polynomial multiplication, this novel broadcast-based convolution operation is more efficient and requires less hardware overhead than using a serial-reduction-based method.

To move from one index of this sum to the next, an in-memory negacyclic shift of the current row of S is used to generate the next row. Again, this is a highly efficient operation since all the data (aside for one element from the end of the array) is only shifted by one column. This shift is also implemented using a fixed geometry swapping pattern.

Finally, the outputs of this polynomial multiplication operation are additively accumulated directly into the correct indices in the output array, without any reduction or other serial operations required to process the result.

Current state-of-the-art PIM architectures for AI acceleration rely on serial reduction operations when performing convolution. Because most convolutions for AI applications are small, this is not a major issue. However, the convolutional operations necessary for schoolbook polynomial multiplications are much wider, so this causes a significant performance bottleneck. By leveraging structured swapping patterns to implement a broadcast-plus-shift scheme, the disclosed SPAM-SRAM can efficiently perform wide polynomial convolutions.

The Number Theoretic Transform (NTT) is another method to multiply wide polynomials used by the cryptographic algorithms Kyber and Dilithium. To be fully compliant with NIST standards for these two algorithms as written, any hardware must be able to efficiently compute the NTT. For security-conscious applications like credit cards and ID badges, where standards-compliance is key, this is an important feature.

The NTT has a very complex dataflow that involves repeatedly shuffling data around in a "butterfly" pattern. This usually makes designing hardware to run the NTT efficiently very difficult. By leveraging insights into the structure of the NTT, the disclosed swapping-pattern-based approach allows us to implement the NTT more efficiently than the state-of-the-art.

Figure 19:
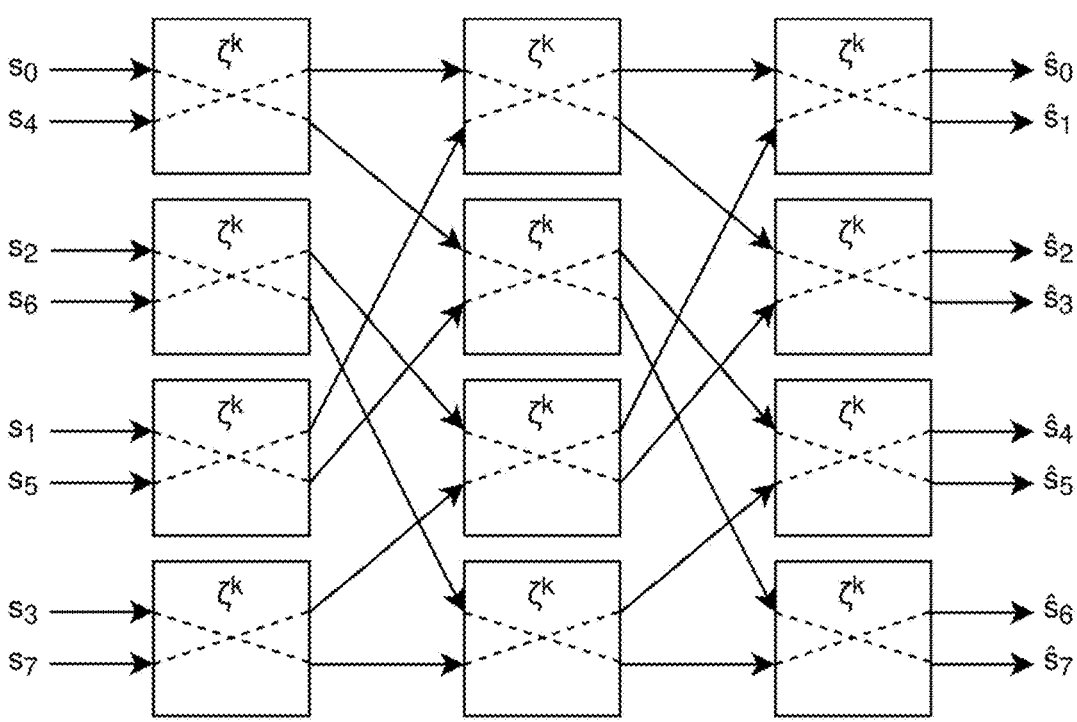
FIG. 19 illustrates constant-geometry NTT dataflow.

It is possible to chain together NTT butterflies such that the routing between butterflies does not change from round to round; this is called the "constant geometry" NTT. A constant geometry NTT is shown for n=8 in FIG. 19. This NTT computation is performed from left to right, where all the butterflies in one column are computed in parallel before moving to the next. Note that each column performs the same computation, unlike a typical variable-geometry NTT configuration, and that the values for (k for each butterfly vary. This constant-geometry NTT itself is not novel, but it is leveraged in the disclosed design.

The constant geometry NTT is well-suited to the swapping-pattern-based routing architecture of the CASH. All the inter-column communication for the NTT can be mapped to a pair of pre-defined dataflows, which can be enabled by the programmer when the CASH is performing an NTT.

Such a swapping pattern represents a significant reduction in hardware overhead for implementing the NTT because a constant-geometry design does not require large multiplexing circuits that would be present in a variable-geometry design and increase the power, area, and delay of the circuit.

Figure 20:
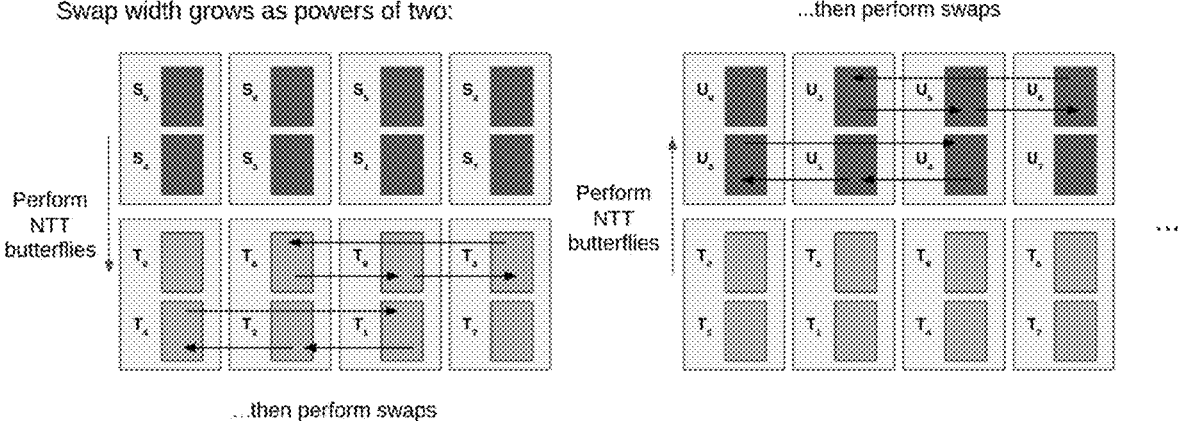
FIG. 20 illustrates in-memory NTT constant-geometry swapping pattern.

To perform this operation, an input vector is loaded into two multi-row sections of memory, as shown in FIG. 20. Butterfly operations are then performed simultaneously on every column, taking each stacked pair of input values and computing an NTT butterfly on them to yield two stacked values below. Addition, multiplication by twiddle factors, and reduction mod p is performed all using the SPAM-SRAM's PIM hardware. The values of the two output rows are then moved from column to column based on the constant-geometry NTT using swapping patterns designed to match the NTT dataflow.

Then, the next set of NTT butterflies are performed, taking the bottom two rows as an input and outputting to the top two rows. Next, the same swaps are applied to the top two rows. This pattern repeats until the NTT is complete.

Determining the most efficient mapping of the swapping pattern is a highly nontrivial problem. Thus, the most efficient swapping pattern is determined using an automatic search process optimizing for compactness of the swapping module. An example swap pattern for n=8 is shown in FIG. 20.

While multiple SRAM-based PIM technologies exist, the CASH architecture introduces a novel feature to increase the performance of polynomial multiplication in a PIM array: structured "swapping patterns" that allow data to be sent between columns of the array in a number of different arrangements.

By allowing programmers to select from one of a small number of predefined swapping patterns, the CASH achieves a compromise between efficiency and agility. Optimizing the CASH for specific algorithms like Redundant Binary arithmetic operations entails optimizing the swapping patterns used in those algorithms.

Many conventional cryptographic algorithms rely on multiplying high-bit width numbers. These sorts of operations usually require very different hardware than multiplying polynomials. Generally, specialized multipliers for high-bit width numbers can take up a significant amount of area and power on dedicated cryptographic chips, and often are the limiting factor for the overall performance of the design. A method to reduce the area, power, and performance overhead of these large multipliers would help create more efficient and affordable security chips for smart cards, SIM cards, and IoT devices.

Redundant Binary Representations (RBRs) are a class of numeral systems that use two bits to represent each digit of a binary number. RBRs are unique in that they allow addition operations without a typical carry chain. This is important when designing hardware, as the performance of wide-bit width addition is limited by the logical delay through the carry chain.

RBRs are used frequently to implement cryptosystems that rely on wide-bit width arithmetic, like Elliptic Curve Cryptography and RSA. However, these techniques have never been leveraged in PIM systems. The inherent bit-parallelism and wide data widths of PIM arrays makes these architectures synergize particularly well with RBRs of wide-bit width integers.

The disclosed CASH is able to perform both high-bit width arithmetic and polynomial arithmetic using the same hardware, by leveraging a data representation called Redundant Binary Representation (RBR). In the SPAM-SRAM, an RBR number is represented as two rows of memory, each row having the same bit width as the number. The two bit, N-th digit of the RBR number consists of the N-th digit of the first row and the N-th digit of the second row, as shown in FIG. 20.

The RBR used by the SPAM-SRAM represents a 1 using the two-bit digit 11, represents 0 using the two-bit digit 01 and 10, and represents a −1 using the two-bit digit 00, as shown in Table 1. Converting a word from a "two's complement" representation to RBR simply entails adding a row of all 1's as its second set of digits.

TABLE 1

| Mapping RBR Two-Bit Digits to Values | |
| --- | --- |
| Bits | Value |
| 00 | −1 |
| 01 | 0 |
| 10 | 0 |
| 11 | 1 |

Figure 21:
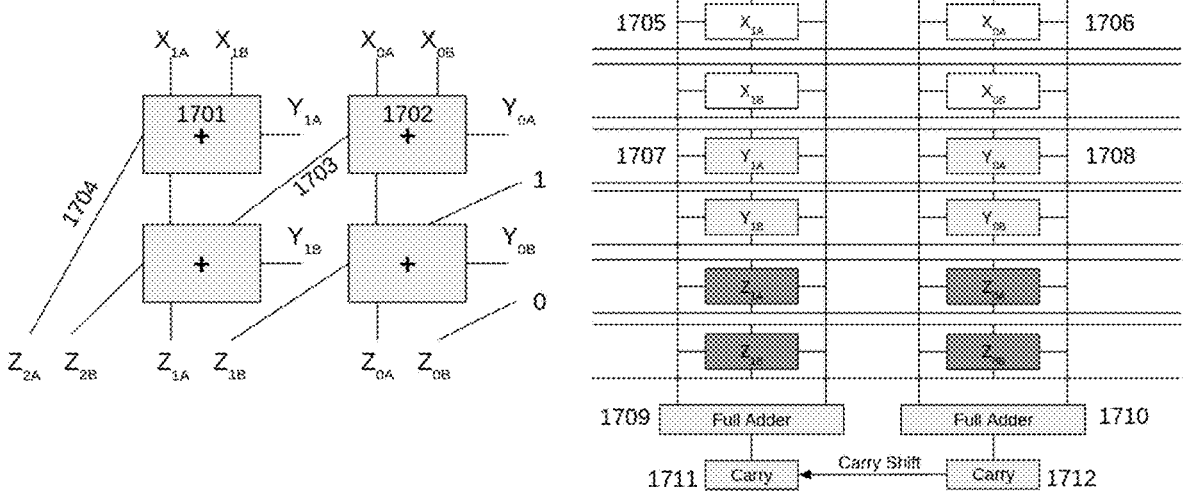
FIG. 21 illustrates mapping RBR addition on the right to the SPAM-SRAM on the left.

This representation allows us to perform addition of RBR digits using full-adders, which are already part of our column logic. By shifting the contents of the carry register, wide-bit width RBR arithmetic can be performed in-memory, as shown in FIG. 21.

In this case, a dual-read operation is performed on the first row, containing cells 1705 and 1706, and the third row, containing cells 1707 and 1708, such that the data in those cells are the inputs to the full adders 1709 and 1710. This performs the computations marked 1701 and 1702. Then, data is shifting from carry latch 1711 to carry latch 1712. This performs the inter-column dataflow marked 1703 and 1704.

This process can be performed across many hundreds of columns of SRAM at once to perform a single step of RBR addition. Once we have the primitive operation of efficient wide-bit width addition, we can combine multiple addition operations to build more complex operations, including multiplication of elliptic curve points.

The foregoing description, for purposes of explanation, used specific nomenclature to provide a thorough understanding of the invention. However, it will be apparent to one skilled in the art that specific details are not required to practice the invention. Thus, the foregoing descriptions of specific embodiments of the invention are presented for purposes of illustration and description. They are not intended to be exhaustive or to limit the invention to the precise forms disclosed; obviously, many modifications and variations are possible in view of the above teachings. The embodiments were chosen and described to best explain the principles of the invention and its practical applications, they thereby enable others skilled in the art to best utilize the invention and various embodiments with various modifications as are suited to the particular use contemplated. It is intended that the following claims and their equivalents define the scope of the invention.

The invention claimed is:

1. A processor, comprising:
a Static Random Access Memory (SRAM) array with individual SRAM cells, each individual SRAM cell comprising six transistors including a first access transistor, a second access transistor, a first N-Channel Metal-Oxide Semiconductor (NMOS) transistor cross-coupled with a first P-Channel Metal-Oxide Semiconductor (PMOS) transistor to form a first inverter, a second NMOS transistor cross-coupled with a second PMOS transistor to form a second inverter;
split word line drivers connected to the SRAM array, the split word line drivers including left word line drivers and right word line drivers that are alternately activated to drive a single sense amplifier per bit line; and
a transpose write driver circuit connected to the SRAM array to implement a data transposition in the SRAM array and select a column of the SRAM array by driving both bit lines associated with the selected column to 0V; and
wherein the split word line drivers simultaneously write data to the selected column of the SRAM array.

2. The processor of claim 1 wherein the split word line drivers read two rows simultaneously to simultaneously drive two outputs to two separate sense amplifiers connected to two separate bit lines.

3. The processor of claim 1 wherein the data transposition is a bit-parallel to bit-serial transposition.

4. The processor of claim 1 further comprising SRAM array column logic including a full-adder circuit, a carry latch circuit, and a mask register.

5. The processor of claim 4 wherein the SRAM array column logic implements high-parallelism bit-serial arithmetic.

6. The processor of claim 4 wherein the SRAM array column logic implements bit-serial addition in each column.

7. The processor of claim 4 wherein the mask register stores a mask specifying whether data is written to bit cells by controlling enable signals to write buffers.

* * * * *